US012809270B2

(12) United States Patent
Krone et al.

(10) Patent No.: US 12,809,270 B2

(45) Date of Patent: Nov. 24, 2026

(54) OPTICAL SYSTEM, LITHOGRAPHY APPARATUS AND METHOD

(71) Applicant: Carl Zeiss SMT GmbH, Oberkochen (DE)

(72) Inventors: Stefan Krone, Ellwangen (DE); Kai Kunze, Schwaebisch-Gmeund (DE); Sven Urban, Neu-Ulm (DE); Philipp Torres Da Silva, Grossbottwar (DE); Thomas Wolfsteiner, Aalen (DE); Martin Kuhnle, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 127 days.

(21) Appl. No.: 18/655,501

(22) Filed: May 6, 2024

(65) Prior Publication Data

US 2024/0288777 A1 Aug. 29, 2024

Related U.S. Application Data

(63) Continuation of application No. PCT/EP2022/081002, filed on Nov. 7, 2022.

(30) Foreign Application Priority Data

Nov. 8, 2021 (DE) ..................... 10 2021 212 553.0

(51) Int. Cl.

| | |
|---|---|
| ***G03F 7/00*** | (2006.01) |
| ***G02B 26/08*** | (2006.01) |
| ***H05K 7/20*** | (2006.01) |

(52) U.S. Cl.

CPC ..... *G03F 7/70233* (2013.01); *G02B 26/0816* (2013.01); *G03F 7/70033* (2013.01);

(Continued)

(58) Field of Classification Search

CPC ............ G03F 7/70033; G03F 7/70075; G03F 7/70116; G03F 7/70233; G03F 7/70833;

(Continued)

(56) References Cited

U.S. PATENT DOCUMENTS 5,508,889 A 4/1996 Ii
6,493,198 B1 12/2002 Arledge et al.

(Continued)

FOREIGN PATENT DOCUMENTS

CN 109297965 A 2/2019
CN 109634065 A 4/2019

(Continued)

OTHER PUBLICATIONS

Taiwanese Office Action, with translation thereof, for corresponding TW Patent Appl. No. 111142422, dated Aug. 2, 2023.

(Continued)

*Primary Examiner* — Deoram Persaud

(74) *Attorney, Agent, or Firm* — Fish & Richardson P.C.

(57) ABSTRACT

A lithography optical system comprises: actuatable individual mirrors; a vacuum-tight housing; and an electronics arrangement integrated in the vacuum-tight housing and configured for individual actuation of each individual mirror. The electronics arrangement has a plurality of electronics modules releasably installed in the vacuum-tight housing and which each have a plurality of interconnected electronic and/or electrical components. A specific electronic module has a PCB, on which the electronic and/or electrical components of the specific electronics module are arranged. The PCB is arranged on a frame of the specific electronics module. The frame has a fastening section to releasably install the specific electronics module in the vacuum-tight housing and/or to connect the specific electronics module to a further electronics module of the electronics arrangement.

(Continued)

When installed, the fastening section of the specific electronics module is in contact with a corresponding fastening section of the vacuum-tight housing and/or of the further electronics module.

20 Claims, 6 Drawing Sheets

(52) U.S. Cl.
CPC ...... *G03F 7/70833* (2013.01); *G03F 7/70841* (2013.01); *G03F 7/70983* (2013.01); *G03F 7/70991* (2013.01); *H05K 7/2039* (2013.01)

(58) Field of Classification Search
CPC ............. G03F 7/70841; G03F 7/70983; G03F 7/70991; G02B 26/0816; H05K 1/0259; H05K 1/0271; H05K 2201/10409; H05K 2201/2018; H05K 7/2039
See application file for complete search history.

(56) References Cited

U.S. PATENT DOCUMENTS

| | | | | |
|---|---|---|---|---|
| 6,573,978 | B1 | 6/2003 | McGuire, Jr. | |
| 6,873,450 | B2 | 3/2005 | Patel et al. | |
| 7,969,549 | B2 | 6/2011 | Boom et al. | |
| 10,018,803 | B2 * | 7/2018 | Horn | G03F 7/70075 |
| 10,761,317 | B2 * | 9/2020 | Hauf | G01D 5/2412 |
| 2004/0070815 | A1 * | 4/2004 | Aubuchon | G02B 26/0841 359/291 |
| 2006/0132747 | A1 | 6/2006 | Singer et al. | |
| 2011/0181852 | A1 * | 7/2011 | Bleidistel | G03F 7/702 355/30 |
| 2014/0055767 | A1 | 2/2014 | Waldis et al. | |
| 2015/0185469 | A1 * | 7/2015 | Horn | G03F 7/70075 359/849 |
| 2016/0170201 | A1 * | 6/2016 | Holz | B81B 7/007 355/77 |
| 2018/0074303 | A1 | 3/2018 | Schwab | |
| 2019/0324372 | A1 | 10/2019 | Wolfsteiner et al. | |

FOREIGN PATENT DOCUMENTS

| | | | |
|---|---|---|---|
| CN | 110954142 | A | 4/2020 |
| CN | 111381355 | A | 7/2020 |
| DE | 10 2008 009 600 | A1 | 8/2009 |
| DE | 10 2010 041 468 | A1 | 3/2012 |
| DE | 10 2016 225 901 | A1 | 3/2017 |
| DE | 10 2017 220 586 | A1 | 5/2019 |
| EP | 1 614 008 | B1 | 1/2006 |
| JP | 4638897 | B2 | 2/2011 |
| TW | 200619678 | A | 6/2006 |
| TW | 200731333 | A | 8/2007 |
| WO | WO 2012/123811 | A2 | 9/2012 |

OTHER PUBLICATIONS

Taiwanese Office Action, with translation thereof, for corresponding TW Patent Appl. No. 111142422, dated Nov. 24, 2023.
Translation of International Search Report for corresponding PCT Appl No. PCT/EP2022/081002, dated Feb. 22, 2023.

* cited by examiner

OPTICAL SYSTEM, LITHOGRAPHY APPARATUS AND METHOD

CROSS-REFERENCE TO RELATED APPLICATIONS

The present application is a continuation of, and claims benefit under 35 USC 120 to, international application No. PCT/EP2022/081002, filed Nov. 7, 2022, which claims benefit under 35 USC 119 of German Application No. 10 2021 212 553.0, filed Nov. 8, 2021. The entire disclosure of each of these applications is incorporated by reference herein.

FIELD

The present disclosure relates to an optical system, to a lithography apparatus having such an optical system, and to a method for producing such an optical system.

BACKGROUND

Microlithography is used for producing microstructured components, such as, for example, integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light having a wavelength in the range from 0.1 nm to 30 nm, for example 13.5 nm, are currently under development. Since most materials absorb light at this wavelength, reflective optical units, that is to say mirrors, are used in such EUV lithography apparatuses in place of refractive optical units, that is to say lenses—which have been used to date.

Optical elements or modules used in EUV lithography apparatuses for example should have very high levels of cleanliness since even very small particles are able to influence the radiation on account of the short wavelength of the EUV radiation. Therefore, these elements or modules, which also have electronics in addition to optical surfaces, are assembled in a cleanroom environment with a high cleanliness class. The electronics of such modules are typically destined for operation under atmospheric pressure, which is why these are to be integrated in an appropriate housing. This step, too, is implemented under cleanroom conditions in order to avoid contamination of the optical elements arranged on the module. Producing the modules under cleanroom conditions can mean that the workers who produce the optical modules from individual parts can have restricted vision and restricted freedom of movement in the work clothes used for a cleanroom. Moreover, it is not possible to use all desired tools. Further, there can be an increased risk of electrostatic charging of the work clothes in the cleanroom, which may discharge over the electronics and may damage the electronics. The work conditions in the cleanroom therefore can make the production of the optical module more difficult, and the additional risks have only been able to be partially reduced to date by increased care and accordingly a reduced speed of work.

SUMMARY

The present disclosure seeks to provide an improved optical system and an improved method for producing an optical system.

According to a first aspect, the disclosure comprises an optical system for a lithography apparatus, such as a micromirror arrangement. The optical system comprises a plurality of actuatable individual mirrors, a vacuum-tight housing and an electronics arrangement, which is integrated in the vacuum-tight housing and configured to individually actuate each individual mirror. The electronics arrangement has a plurality of electronics modules which are releasably installed in the vacuum-tight housing and which each have a plurality of interconnected electronic and/or electrical components. At least one specific electronics module of the plurality thereof has a printed circuit board, on which the electronic and/or electrical components of the specific electronics module are arranged, and wherein the printed circuit board is arranged on a frame of the specific electronics module, wherein the frame has at least one fastening section, which is provided to releasably install the specific electronics module in the vacuum-tight housing and/or to connect the specific electronics module to a further electronics module of the electronics arrangement, wherein the at least one fastening section of the specific electronics module, in the state where it is installed in the vacuum-tight housing, is in contact with a corresponding fastening section of the vacuum-tight housing and/or of the further electronics module.

The specific electronics module can be easier to handle by the worker and the risk of the specific electronics module being damaged during the installation can be significantly reduced. In this case, the frame of the specific electronics module can enable simpler and safer handling of the electronics module during the installation; for example, there can be secure and stable fastening of the electronics module in the vacuum-tight housing and the electronics arrangement via the fastening section, with it being possible to use fastening mechanisms that can be easier to handle than those used for conventional electronics modules, which for example are fastened directly to the printed circuit board.

All electronics modules which are to be installed into the vacuum-tight housing by a worker in the cleanroom as described above can have the features of the specific electronics module. However, the features may be formed differently in different electronics modules.

In some embodiments, the electronics arrangement can be taken apart again, that is to say the individual electronics modules are able to be removed from the vacuum-tight housing. This may become desirable should one or more of the electronics modules be found to have a fault upon commissioning or within the scope of a functionality test. Removal can also be simplified significantly by the features of the specific electronics module.

By way of example, the optical system is a micromirror array. In this context, a respective micromirror can be assigned at least one actuator/sensor unit, which cam be configured to displace the micromirror and/or to sense a position and alignment of the micromirror. The electronics arrangement can be configured to control all micromirrors of the array. To this end, the electronics arrangement may have a hierarchic structure with a tree structure which reaches from a high level, for example a central control unit, to a low level, which comprises the individual actuator/sensor units. The electronics arrangement may have a multiplicity of similar electronics modules, such as the actuator/sensor units for example, each of which can be installed individually in the electronics arrangement.

The vacuum-tight housing can be configured to accommodate the electronics arrangement and keep the latter under atmospheric pressure even if the optical system overall is installed in a vacuum housing. The vacuum-tight housing can have fastening sections which are configured to fasten the electronics arrangement and/or individual electronics modules, for example the specific electronics module, in the vacuum-tight housing. The vacuum-tight housing may comprise (or consist of) metal, for example. Moreover, the vacuum-tight housing can have an openable flap or lid, with the electronics modules being installable in, or removable from, the vacuum-tight housing in an open state of the flap or lid. Vacuum tightness of the housing can be attained in a closed state of the flap or lid. The plurality of actuatable individual mirrors can be arranged outside of the vacuum-tight housing.

A respective electronics module being releasably installed in the vacuum-tight housing is understood to mean that, in the installed state, the respective electronics module is connected to the vacuum-tight housing or further electronics modules of the electronics arrangement in such a way that it is able to be removed without being destroyed. For example, a utilized connecting or fastening element does not have an integral bond, but rather has an interlock or else a frictional connection, such as a screwed connection, a clamp or else a latching element.

For example, a respective electronics module comprises a printed circuit board, on which the electrical and/or electronic components are arranged. The electronic and/or electrical components of a respective electronics module may comprise both conventional component parts, such as capacitors, coils or resistors, and semiconductor component parts, such as diodes or transistors. For example, the electronic component parts may further comprise integrated circuits, such as processors or the like, or else power electronics.

For example, the electronics arrangement comprises one or more actuator/sensor devices, which are each assigned to one of the individual mirrors of the optical system. A respective actuator/sensor device may be configured to displace the assigned individual mirror, to sense a position of the assigned individual mirror or else to displace and sense the position of the assigned individual mirror.

For example, the frame of the specific electronics module imparts a certain mechanical stability to the latter. For example, the frame is a stiff and rigid structure. For example, the frame comprises plastics, metal, composite material and the like. For example, the frame is produced from plastic, such as a thermoplastic, from metal, such as aluminium, steel, copper or brass, or a composite material, such as a carbon fibre material. The material from which the frame is manufactured has, for example, a shear modulus of more than 10 GPa, such as more than 50 GPa, for example a Young's modulus of more than 20 GPa, for instance more than 80 GPa, and a bulk modulus of more than 50 GPa, such as more than 100 GPa.

The frame can be designed to hold the printed circuit board of the specific electronics modulus. Further elements of the specific electronics module, such as an interface comprising sockets and/or plugs, may likewise be fastened to the frame. For example, the frame has a mechanical stability and torsional resistance that is greater than a mechanical stability and torsional resistance of a conventional printed circuit board. Hence, the frame can form the preferred point of attack for a mechanical assembly of the specific electronics module.

The frame may be formed in different geometric shapes, for example as a single elongate element that forms a type of spine, or as an edging of the printed circuit board, or as a plate that has substantially the same shape as the printed circuit board of the electronics module.

The frame can have at least one fastening section which is provided for fastening the specific electronics module in the vacuum-tight housing and/or to a further electronics module of the electronic arrangement. A respective fastening section is formed, for example, as a drilled hole in the frame, through which a screw can be guided in order to screw together the electronics module and the vacuum-tight housing or the further electronics module. Further, a fastening section may be formed, for example, as a protrusion or a notch, wherein a corresponding element of the vacuum-tight housing or of the further electronics module engages in the protrusion or the notch and hence fixes the specific electronics module.

The use of the frame for fixing the electronics module can provide a secure and stable fastening at only a few points, for example at only one point or at only two points, since the frame imparts a high stability on the electronics module in comparison with a printed circuit board. On account of the high mechanical stability of the frame, a high retention force can be used at each fastening point of the frame. Furthermore, the fastening sections may have a generous embodiment in comparison with those on conventional printed circuit boards, and so for example it is possible to use larger screws, which are hence easier to handle. By way of example, it is possible to choose screws with a diameter of more than 4 mm.

According to an embodiment of the optical system, the specific electronics module has a number of holding mechanisms and/or a number of protection elements, wherein the respective holding mechanism is configured to securely hold the specific electronics module while the specific electronics module is being installed in the vacuum-tight housing, and wherein the respective protection element is configured to protect at least a subset of the electronic and/or electrical components of the specific electronics module from mechanical damage and/or from an electrostatic discharge.

As a result of the holding mechanism specifically provided for securely holding the electronics module, the worker may for example place suitable tools against the specific electronics module in order, for example, to bring the electronics module into the correct installation position for the installation in the vacuum-tight housing. Hence, the worker need not grasp the electronics module in their gloved hand, which is why there is a reduced risk of an electrostatic discharge which could damage the components of the electronics module.

By way of the protection element, the electrical and/or electronic components, which are arranged without protection on a circuit board in the case of conventional electronic modules, can be covered and hence protected. For example, the protection element provides both mechanical protection and a protection against electrostatic discharge.

By way of example, the holding mechanism comprises a handle, with the handle being designed for example for holding the electronics module, that is to say for example having a greater mechanical stability than a printed circuit board and being electrically insulated from the electrical and/or electronic components of the electronics module.

Hence, a worker can use the holding mechanism without hesitation for holding the electronics module during an installation or removal of the specific electronics module.

By way of example, the protection element is a planar element such as a sheet or a plastic plate, which covers the respective electronics module sectionally. The electrical and/or electronic components arranged below the protection element are therefore not exposed but instead covered and hence protected. The protection element itself can be securely connected to the specific electronics module; however, it may also be releasably arranged on the electronics module, for example it may be screwed to the latter.

According to an embodiment of the optical system, the holding mechanism comprises a receptacle for a tool such that the specific electronics module is held by the tool when the tool is connected to the receptacle.

For example, the receptacle is configured to establish a releasable connection to the tool. Hence, the tool can be connected to the receptacle for the purposes of installing or removing the electronics module, and can subsequently be released again. Therefore, the tool is designed specifically for the use with the respective receptacle for example. It would also be possible to say that the receptacle and the tool have functional elements corresponding to one another, for example a drilled hole with a female thread and a corresponding male thread. The holding mechanism is further integrated in the electronics module in such a way that the force to install the electronics module can be exerted by way of the receptacle without the electronics module being damaged.

According to an embodiment of the optical system, the protection element is designed as a planar, rigid element that partly covers the printed circuit board on at least one side.

According to an embodiment of the optical system, the protection element completely covers the printed circuit board on at least one side.

According to an embodiment of the optical system, the protection element comprises a plastic, a metal and/or a composite.

According to an embodiment of the optical system, the respective protection element has an electrically insulating layer.

The electrical and/or electronic components of the specific electronics module may be taken by the gloved hand of the worker or touched by the worker, without there being the risk of an electrostatic discharge over the electrical and/or electronic components.

The electrically insulating layer may be integrated on an outer or inner surface of the protection element and/or be integrated in the protection element in sandwich-like fashion.

According to an embodiment, the holding mechanism is integrated in the frame.

This can help ensure that high force can be transferred to the specific electronics module via the holding mechanism, without this damaging the printed circuit board of the electronics module. By way of example, the holding mechanism is designed as a drilled hole with a female thread, into which a suitable tool is able to be screwed. Such a screwed connection cam be reliable, and easy to establish and release again. The holding mechanism may also be designed as a clampable section which can be grasped and clamped using suitable pliers or a vice, with the frame having a particularly stable design in the region of the holding mechanism so that a clamping force for reliable clamping can be absorbed by the frame without damage.

According to an embodiment of the optical system, the protection element is fastened to the frame.

This measure also contributes to the protection of the printed circuit board and the electrical and/or electronic components of the specific electronics module.

According to an embodiment of the optical system, the frame is in direct thermal contact with an electronic and/or electrical component of the specific electronics module and configured to dissipate thermal energy produced by the electronic and/or electrical component during the operation of the optical system and transfer the thermal energy to a heatsink of the electronics module and/or vacuum-tight housing.

It would also be possible to say that the frame serves as the heatsink for the respective component of the electronics module.

The frame can have a high thermal conductivity in the section between the component and the heatsink, the thermal conductivity for example being greater than or equal to 200 W/mK, such as greater than or equal to 400 W/mK.

The heatsink of the electronics module or vacuum-tight housing is an actively cooled heatsink for example. By way of example, a coolant flows through the heatsink.

According to an embodiment of the optical system, the frame comprises a metal. By way of example, the frame comprises (or consists of) a metal.

The metal can be a pure metal, for example copper or aluminium, or an alloy, for example brass or steel. The frame may comprise (or consist of) different materials on a sectional basis, for example comprise (or consist of) steel in regions where high stability is involved and comprise (or consist of) copper in regions where good thermal conductivity is desired.

According to an embodiment of the optical system, the optical system is provided for use in a vacuum housing of an EUV lithography apparatus. To this end, the optical system is assembled in a cleanroom of class 6 or higher pursuant to ISO 14644-1.

This can help ensure the desired cleanliness of the optical system. However, assembly in the cleanroom can mean that the assembly is made more difficult. This can be due, firstly, to the work clothes for the cleanroom, especially a whole-body suit with gloves and a head covering with a visor, and, secondly, also due to the fact that there is a restricted selection of tools that are usable for the assembly. To counteract this effect, the electronics module can have at least some of the features described above.

The individual electronics modules which are assembled to form the electronics arrangement for the optical system in the cleanroom can be preassembled electronics modules for example. That is to say that these were produced in another production apparatus, external to the cleanroom, from the respective individual parts, such as the electrical and/or electronic components, the printed circuit board, the frame, the holding mechanism and/or the protection element. The respective electronics module is cleaned, for example wet-chemically cleaned, following the production thereof in the other production apparatus. This cleaning ensures that the respective electronics module is free from particles that would contaminate the cleanroom. For example, the same cleanliness class as for the cleanroom also applies to the cleanliness of the electronics module post cleaning. To transport the respective electronics module from the other production apparatus to the cleanroom, it is packaged in air-tight fashion, for example welded into a foil. The packaging initially is to be removed from the electronics module in the cleanroom. The glove of the worker is frequently electrostatically charged already during this work step. Without the protection element, the electrostatic charge could discharge from the glove via the (unprotected) components of the respective electronics module and destroy these. This is prevented by the protection element; further, a corresponding holding mechanism can be used so that the worker no longer need grasp the respective electronics module with their glove.

The optical system can be a projection optical unit of the projection exposure apparatus. However, the optical system can also be an illumination system. The projection exposure apparatus can be a EUV lithography apparatus. EUV stands for "extreme ultraviolet" and denotes a wavelength of the working light of between 0.1 nm and 30 nm. The projection exposure apparatus can also be a DUV lithography apparatus. DUV stands for "deep ultraviolet" and denotes a wavelength of the working light of between 30 nm and 250 nm.

According to a second aspect, a lithography apparatus is proposed, which comprises an optical system according to the first aspect.

For example, the lithography apparatus is designed as an EUV lithography apparatus and comprises one or more vacuum housings. For example, the optical system is arranged in one of the vacuum housings. By way of example, the optical system is designed as a micromirror array or as a facet mirror.

A method for producing an optical system for a lithography apparatus is proposed according to a third aspect. A plurality of individual mirrors are provided in a first step. A vacuum-tight housing is provided in a second step. A plurality of electronics modules are provided in a third step, wherein each electronics module has a plurality of interconnected electronic and/or electrical components and wherein at least one specific electronics module of the plurality thereof has a printed circuit board, on which the electronic and/or electrical components of the specific electronics module are arranged. The printed circuit board is arranged on a frame of the specific electronics module, wherein the frame has at least one fastening section, which is provided to releasably install the specific electronics module in the vacuum-tight housing and/or to connect the specific electronics module to a further electronics module of the electronics arrangement, wherein the at least one fastening section of the specific electronics module, in the state where it is installed in the vacuum-tight housing, is in contact with a corresponding fastening section of the vacuum-tight housing and/or further electronics module. The plurality of electronics modules are installed in the vacuum-tight housing under cleanroom conditions in a fourth step, wherein the respective fastening section is brought into contact with the respective corresponding fastening section such that the electronics modules together form an electronics arrangement which is configured to individually actuate each individual mirror. The electronics arrangement is coupled to the individual mirrors in a fifth step in order to provide the optical system. The fifth step is also implemented under cleanroom conditions.

The embodiments and features described for the optical system apply correspondingly to the proposed method, and vice versa.

"A(n)" in the present case should not necessarily be understood to be restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also comprise not explicitly mentioned combinations of any features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below. The disclosure is explained in greater detail below on the basis of preferred embodiments with reference to the appended figures.

EXEMPLARY EMBODIMENTS

Unless indicated otherwise, elements that are the same or functionally the same have been given the same reference signs in the figures. It should also be noted that the illustrations in the figures are not necessarily true to scale.

Figure 1:
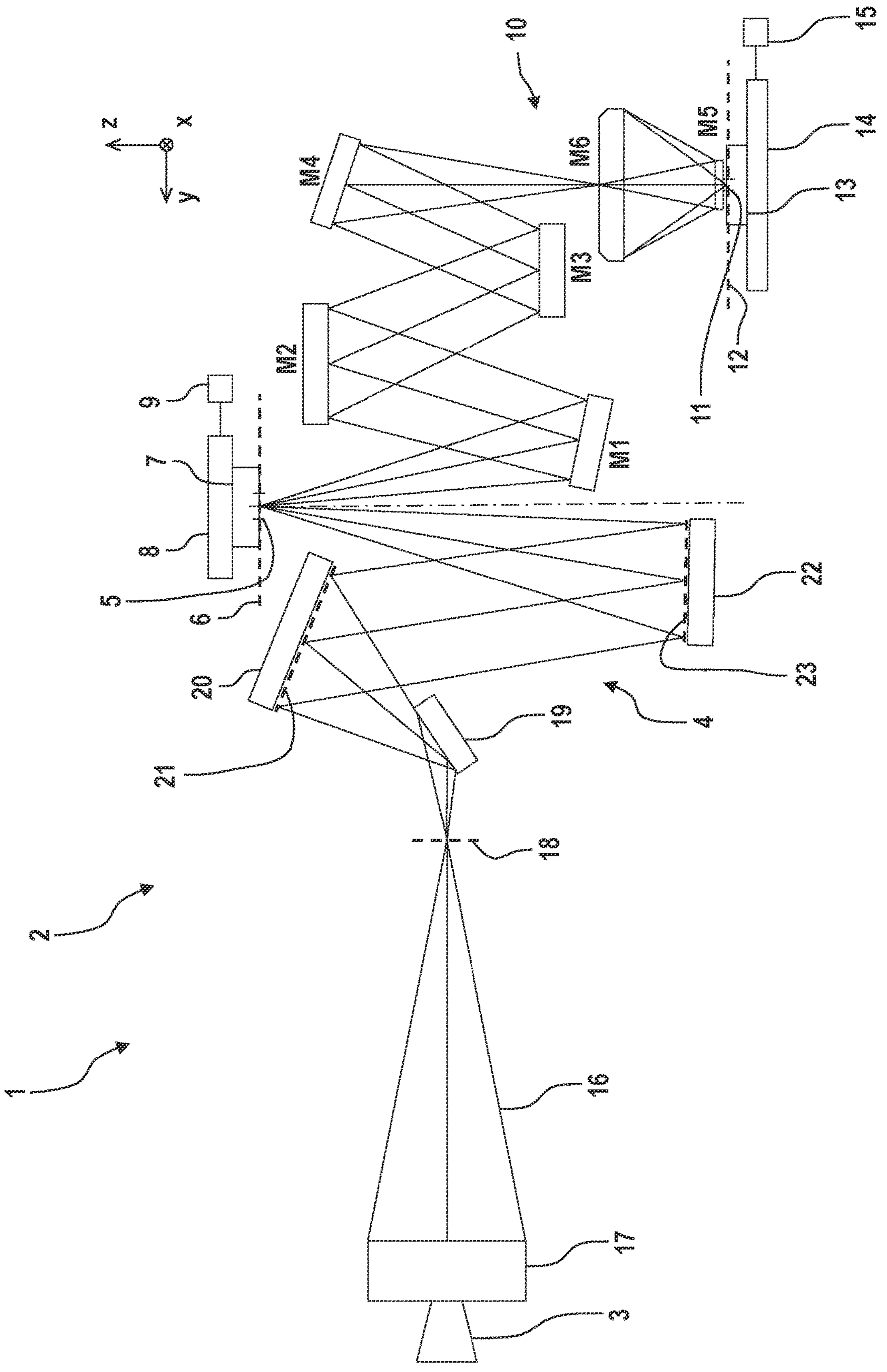
FIG. 1 shows a schematic meridional section of a projection exposure apparatus for EUV projection lithography.

FIG. 1 shows an embodiment of a projection exposure apparatus 1 (lithography apparatus), for example an EUV lithography apparatus. One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs along the y-direction y. The z-direction z runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle between the object plane 6 and the image plane 12 that differs from 0° is also possible.

A structure on the reticle 7 is imaged onto a light-sensitive layer of a wafer 13 that is arranged in the region of the image field 11 in the image plane 12. The wafer 13 is held by a wafer holder 14. The wafer holder 14 is displaceable by way of a wafer displacement drive 15, for example along the y-direction y. The displacement, on the one hand, of the reticle 7 by way of the reticle displacement drive 9 and, on the other hand, of the wafer 13 by way of the wafer displacement drive 15 can take place in such a way as to be synchronized with each other.

The light source 3 is an EUV radiation source. The light source 3 emits, for example, EUV radiation 16, which is also referred to below as used radiation, illumination radiation or illumination light. For example, the used radiation 16 has a wavelength in the range between 5 nm and 30 nm. The light source 3 can be a plasma source, for example an LPP (laser produced plasma) source or a GDPP (gas discharge produced plasma) source. It can also be a synchrotron-based radiation source. The light source 3 can be an FEL (free-electron laser).

The illumination radiation 16 emerging from the light source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 can be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 can represent a separation between a radiation source module, having the light source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which can also be referred to as field facets. Only some of these first facets 21 are shown in FIG. 1 by way of example.

The first facets 21 can be in the form of macroscopic facets, for example in the form of rectangular facets or in the form of facets with an arcuate edge contour or an edge contour of part of a circle. The first facets 21 may be in the form of plane facets or alternatively in the form of convexly or concavely curved facets.

As known for example from DE 10 2008 009 600 A1, the first facets 21 themselves may also be composed in each case of a multiplicity of individual mirrors, for example a multiplicity of micromirrors. The first facet mirror 20 can for example be embodied in the form of a microelectromechanical system (MEMS system). For details, reference is made to DE 10 2008 009 600 A1.

Between the collector 17 and the deflection mirror 19, the illumination radiation 16 travels horizontally, that is to say along the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can for example have a round, rectangular or hexagonal edge, or can alternatively be facets composed of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This fundamental principle is also referred to as a fly's eye condenser (fly's eye integrator).

It can be advantageous to arrange the second facet mirror 22 not exactly in a plane that is optically conjugate to a pupil plane of the projection optical unit 10. For example, the second facet mirror 22 may be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or actually the last mirror for the illumination radiation 16 in the beam path upstream of the object field 5.

In a further embodiment, not shown, of the illumination optical unit 4, a transfer optical unit contributing for example to the imaging of the first facets 21 into the object field 5 can be arranged in the beam path between the second facet mirror 22 and the object field 5. The transfer optical unit can have exactly one mirror, or alternatively have two or more mirrors, which are arranged one behind the other in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20 and the second facet mirror 22.

In a further embodiment of the illumination optical unit 4, there is also no need for the deflection mirror 19, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are similarly possible. The projection optical unit 10 is a twice-obscured optical unit. The penultimate mirror M5 and the last mirror M6 each have a through opening for the illumination radiation 16. The projection optical unit 10 has an image-side numerical aperture that is greater than 0.5 and may also be greater than 0.6, and may be for example 0.7 or 0.75.

Reflection surfaces of the mirrors Mi can be embodied as free-form surfaces without an axis of rotational symmetry. Alternatively, the reflection surfaces of the mirrors Mi can be designed as aspheric surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, for example with alternating layers of molybdenum and silicon.

The projection optical unit 10 has a large object-image offset in the y-direction y between a y-coordinate of a centre of the object field 5 and a y-coordinate of the centre of the image field 11. In the y-direction y, this object-image offset can be of approximately the same magnitude as a z-distance between the object plane 6 and the image plane 12.

For example, the projection optical unit 10 can have an anamorphic form. For example, it has different imaging scales βx, βy in the x- and y-directions x, y. The two imaging scales βx, βy of the projection optical unit 10 can be (βx, βy)=(+/−0.25, +/−0.125). A positive imaging scale β means imaging without image inversion. A negative sign for the imaging scale β means imaging with image inversion.

The projection optical unit 10 consequently leads to a reduction in size with a ratio of 4:1 in the x-direction x, that is to say in a direction perpendicular to the scanning direction.

The projection optical unit 10 leads to a reduction in size of 8:1 in the y-direction y, that is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 can be the same or can differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for fully illuminating the object field 5. This may for example produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of fully illuminating the object field 5. The full-area illumination of the object field 5 is for example as homogeneous as possible. It can have a uniformity error of less than 2%. The field uniformity can be achieved by way of the overlay of different illumination channels.

The full-area illumination of the entrance pupil of the projection optical unit 10 can be defined geometrically by an arrangement of the second facets 23. The intensity distribution in the entrance pupil of the projection optical unit 10 can be set by selecting the illumination channels, for example the subset of the second facets 23, which guide light. This intensity distribution is also referred to as illumination setting or illumination pupil filling.

A likewise preferred pupil uniformity in the region of sections of an illumination pupil of the illumination optical unit 4 which are illuminated in a defined manner can be achieved by a redistribution of the illumination channels.

Further aspects and details of the full-area illumination of the object field 5 and for example of the entrance pupil of the projection optical unit 10 are described below.

For example, the projection optical unit 10 can have a homocentric entrance pupil. The latter can be accessible. It can also be inaccessible.

The entrance pupil of the projection optical unit 10 frequently cannot be exactly illuminated with the second facet mirror 22. When imaging the projection optical unit 10, which images the centre of the second facet mirror 22 telecentrically onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component element of the transfer optical unit, should be provided between the second facet mirror 22 and the reticle 7. With the aid of this optical element, the different poses of the tangential entrance pupil and the sagittal entrance pupil can be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted in relation to the object plane 6. The first facet mirror 20 is arranged so as to be tilted in relation to an arrangement plane defined by the deflection mirror 19. The first facet mirror 20 is arranged so as to be tilted with respect to an arrangement plane defined by the second facet mirror 22.

The first facet mirror 20 and the second facet mirror 22 are examples of a respective optical system 100 (see FIG. 2), with the individual facets 21, 23 of the facet mirrors 20, 22 forming the actuatable individual mirrors 101-106 (see FIG. 2) of the optical system 100. In FIG. 1, a plurality of optical systems 100 form a superordinate optical system, such as the illumination optical unit 4, the projection optical unit 10 or the projection exposure apparatus 1.

To individually actuate the facets 21, 22 or other actuatable individual mirrors 101-106 of the respective optical system 100, provision is made, for example, for an electronics arrangement 110 (see FIG. 2), which comprises a plurality of electronics modules 120, 130, 200, 300 (see FIGS. 2 and 4-6). The structure of the optical system 100 with the electronics arrangement 110 and the electronics modules is explained in exemplary, detailed fashion below on the basis of FIGS. 2 and 4-6.

Figure 2:
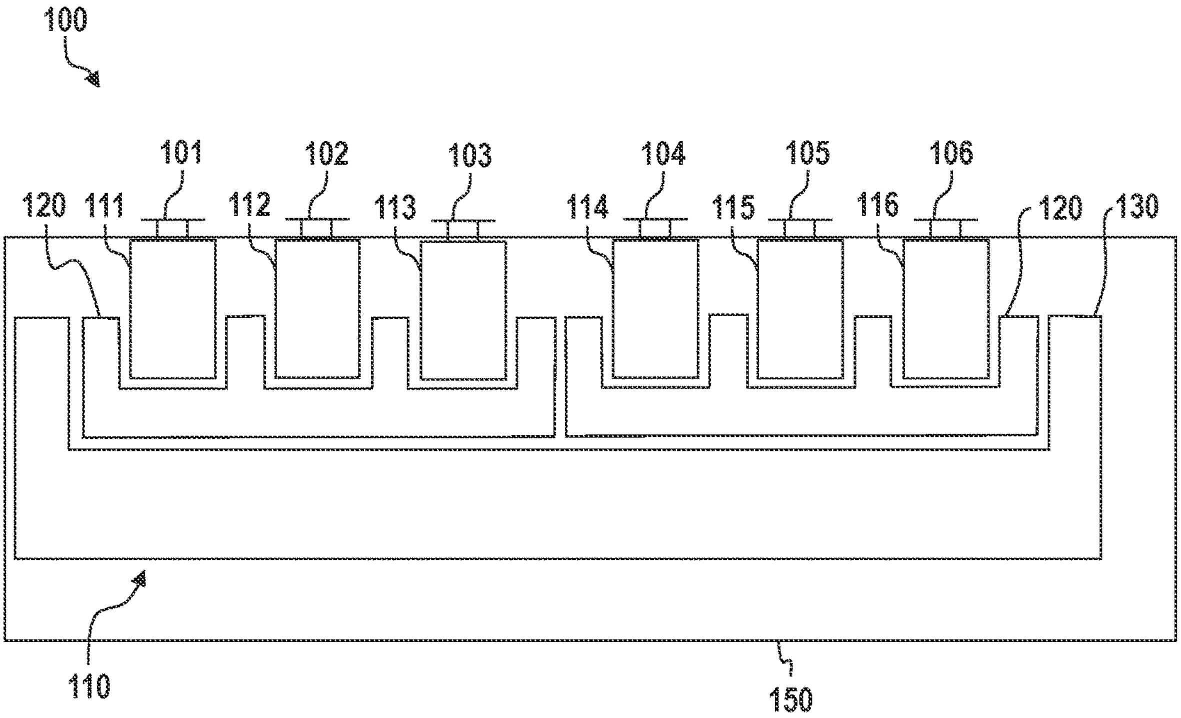
FIG. 2 shows a schematic exemplary embodiment of an optical system having a plurality of actuatable individual mirrors and an electronics arrangement with a plurality of electronics modules.

FIG. 2 shows a schematic exemplary embodiment of an optical system 100 having a plurality of actuatable individual mirrors 101-106 and an electronics arrangement 110 with a plurality of electronics modules 120, 130. The electronics arrangement is integrated in a vacuum-tight housing 150. For example, the optical system 100 forms a micromirror arrangement which comprises several hundred or several thousand individual micromirrors, of which only the six mirrors 101-106 are shown in FIG. 2. The optical system 100 may be designed as the first or the second facet mirror 20, 22 of the projection exposure apparatus 1 in FIG. 1.

The electronics arrangement 110 comprises six actuator/sensor devices 111-116. Each actuator-sensor device 111-116 is assigned one of the individual mirrors 101-106. The respective actuator/sensor device 111-116 is configured to actuate the assigned individual mirror 101-106 and/or to sense a position of the assigned individual mirror 101-106. Attention is drawn to the fact that more than one actuator/sensor device 111-116 may be assigned to a respective individual mirror 101-106 in embodiments. The actuator/sensor devices 111-116 are housed in the vacuum-tight housing 150, with there being a functional connection to the respective assigned individual mirror 101-106.

The electronics modules 120, 130 are electrically interconnected and may also be mechanically interconnected. Some of the electronics modules 120, 130 may be fastened directly to the vacuum-tight housing 150, while other electronics modules may be fastened to these directly fastened electronic modules 120, 130 (see also FIG. 6 in this respect). By way of example, the electronics arrangement 110 is produced by virtue of the plurality of electronics modules 120 being installed in the electronics module 130 and being connected to the latter. Then, the electronics arrangement 110 may be installed overall in the vacuum-tight housing 150. Alternatively, each electronics module 120, 130 is successively installed in the vacuum-tight housing 150. During installation, mechanical fastening and electrical contacting of the electronics modules 120, 130 among one another is implemented in order to form the electronics arrangement 110. The electronics arrangement 110 is installed in such a way that it can be taken apart again so as to be able to allow the repair of the electronics arrangement 110 in the case of a fault in the electronics module 120, 130 or in one of the actuator/sensor devices 111-116. Since the micromirror arrangement 110 is inserted in a vacuum housing of an EUV lithography apparatus for example, it is desirable to carry out the assembly of the micromirror arrangement 100 in a cleanroom environment. By way of example, the cleanroom environment is of class 6 or higher pursuant to ISO 14644-1. Assembling the micromirror arrangement 100 in a cleanroom environment is complicated. Particularly if the assembly is carried out by hand by a worker, there is an elevated risk of damaging one of the electronics modules 120, 130 during the installation, be it due to mechanical damage or due to an electrostatic discharge. To reduce the risk of such damage, at least one of the electronics modules 120, 130 has a frame 220, 330 (see FIG. 4 or 5). Further, the respective electronics modules may have holding mechanisms 212, 312 (see FIG. 4 or 5) and/or a protection element 220, 320 (see FIG. 4 or 5), as explained below on the basis of FIGS. 4-6. For reasons of clarity, the frame 230, 330, the holding mechanisms 212, 312 and the protection element 220, 230 have not been depicted in FIG. 2.

For example, the electronics modules 120 are designed as drive units for a plurality of actuators/sensor devices 111-116. Each drive unit 120 is assigned three actuator/sensor devices 111-116 in this example; however, this number may also be greater or fewer in further embodiments, for example only two or up to four or even more actuator/sensor devices 111-116 may be assigned to a respective drive unit. The drive units 120 comprise, for example, a control logic, a control loop and/or power electronics, which are configured to provide an operating voltage and operating current for the actuator/sensor devices 111-116.

The drive units 120 are coupled to a further electronics module 130, which is designed as a control unit for example. The control unit 130 is configured to determine and output drive data for the drive units 120. By way of example, the control unit 130 determines the drive data on the basis of a control program, on the basis of sensor data and/or on the basis of control data from a central control device, for example a control computer for controlling the EUV lithography apparatus (not depicted here).

Figure 3:
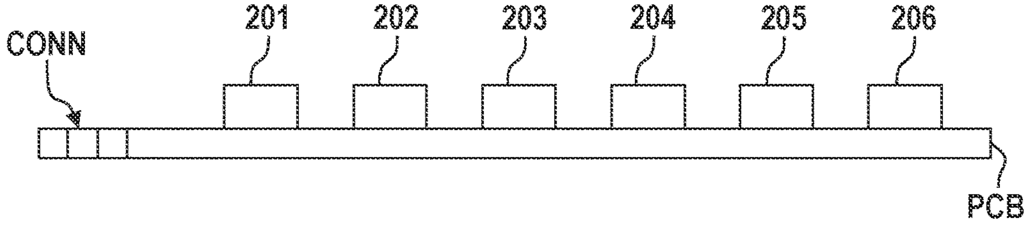
Fig. 3 (Prior art)
FIG. 3 shows a schematic exemplary embodiment of a conventional electronics module.

FIG. 3 shows a schematic exemplary embodiment of a conventional electronics module. The conventional electronics module comprises a printed circuit board PCB with a plurality of electronic and/or electrical components 201-206 arranged thereon. By way of example, the electronic and/or electrical components 201-206 comprise resistors, capacitors, inductors, diodes, transistors, logic gates, integrated circuits, for example ASICs (application-specific integrated circuits), processors and/or memory chips. The electronic and/or electrical components 201-206 are interconnected via the printed circuit board PCB and provide a certain functionality, for example the functionality of a drive unit 120 (see FIG. 2). A plug-in connector CONN is configured to connect the conventional electronics module to another electronics module to form an electronics arrangement. In this case, the plug-in connector CONN establishes both a mechanical connection and an electrical connection to the other electronics module. The conventional electronics module can easily be damaged during handling, for example during installation in or removal from the vacuum-tight housing 150 (see FIG. 2 or 6), since the components 201-206 are unprotected and, further, no specific holding mechanisms are present.

Figure 4:
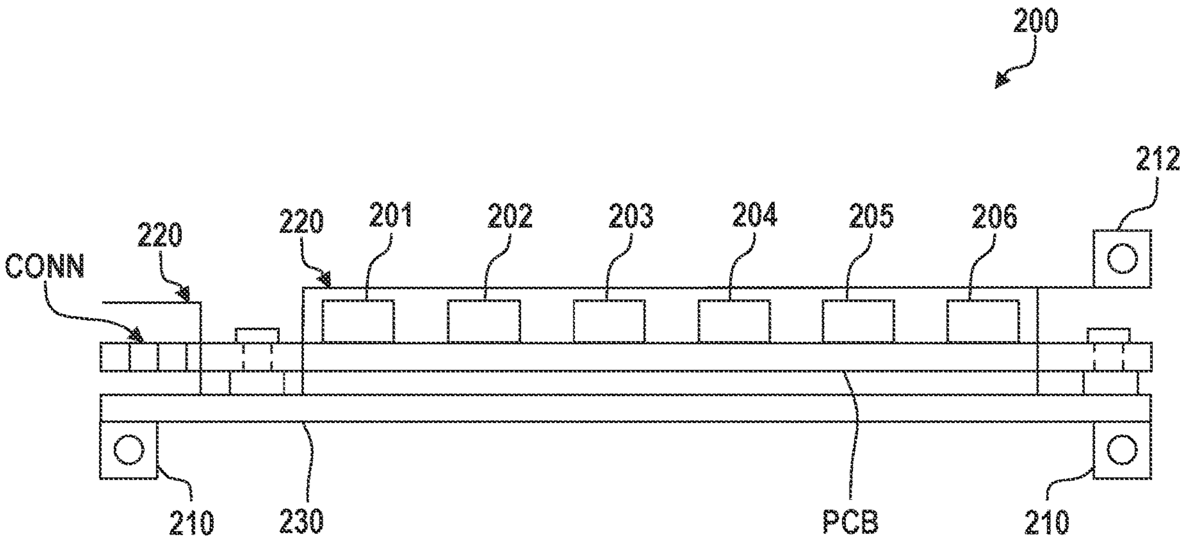
FIG. 4 shows a schematic first exemplary embodiment of an electronics module.

FIG. 4 shows a schematic first exemplary embodiment of an electronics module 200, which differs from the conventional electronics module in FIG. 3 by virtue of, for example, provision being made of a frame 230, on which the printed circuit board PCB is fastened and which has fastening sections 210 by which the electronics module 200 can be fastened in the vacuum-tight housing 150 and/or be connected to further electronics modules of the electronics arrangement. This significantly simplifies the assembly of the electronics module 200 since the frame 230 has a particularly high mechanical stability and absorbs forces acting on the electronics module 200. Hence, the printed circuit board PCB, for example, is protected from these forces.

In this example, the fastening sections 210 are formed as counter bearings with openings for bolts or screws in the frame. The fastening sections 210 allow the electronics module 200 to be stably and securely mechanically connected to the vacuum-tight housing 150 and/or to a further electronics module to form an electronics arrangement 110 (see FIG. 2). Hence, the plug-in connector CONN is mechanically unburdened and only used for the electrical contacting of the electronics module 200.

Moreover, the electronics module 200 has a holding mechanism 212 and two protection elements 220. In this example, the holding mechanism 212 is arranged on one of the protection elements 220 but it may also be fastened directly to the frame 230. A worker can fasten a tool 400, for example temporarily, to the holding mechanism 212 (see FIG. 6) in order to hold the electronics module 200 for the installation in or the removal from the vacuum-tight housing 150. In this example, the two protection elements 220 are fastened to the frame 230 but these may also be arranged on the printed circuit board PCB in embodiments. One of the protection elements 220 covers the plug-in connector CONN. This minimizes the risk of an electrostatic discharge via the lines of the plug-in connector CONN damaging one of the components 201-206. The further protection element 220 covers the components 201-206. Hence, the components 201-206 are protected against mechanical damage and electrostatic discharge. The respective protection element 220 can comprise (or consist of) a metal sheet.

Further features of the electronics module 200 for example correspond to those of the conventional electronics module. By way of example, the electronics module forms a drive unit 120 (see FIG. 2) or a control unit 130 (see FIG. 2).

Figure 5:
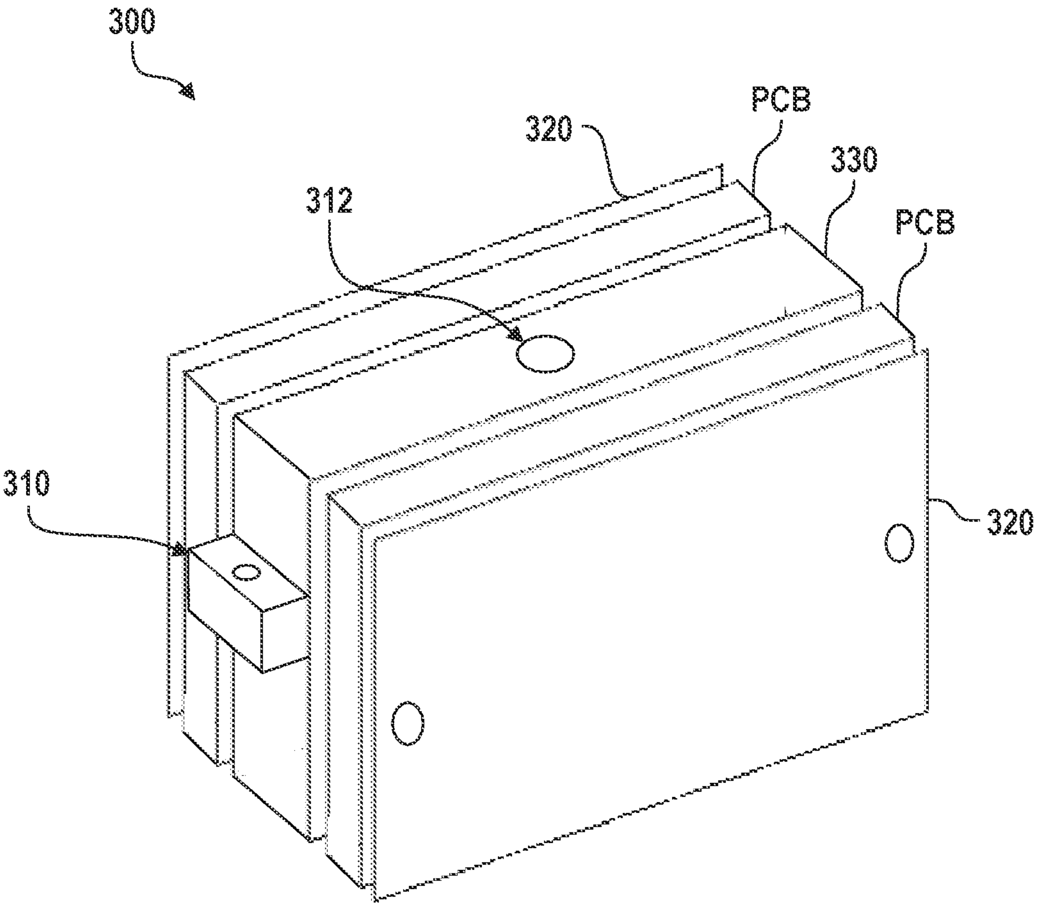
FIG. 5 shows a schematic second exemplary embodiment of an electronics module.

FIG. 5 shows a schematic second exemplary embodiment of an electronics module 300. In this example, the electronics module 300 comprises two printed circuit boards PCB equipped with respective electrical and/or electronic components 201-206 (see FIG. 4), with these printed circuit boards each being covered and hence protected by a slab-like protection element 320. Furthermore, the electronics module 300 has a frame 330, which gives the electronics module 300 great mechanical stability. For example, the two printed circuit boards PCB and the protection elements 320 are fastened to the frame 330, for example screwed to the latter. By way of example, the electronics module 300 is designed as a drive unit for driving a plurality of actuator/sensor devices 111-116 (see FIG. 2).

Figure 6:
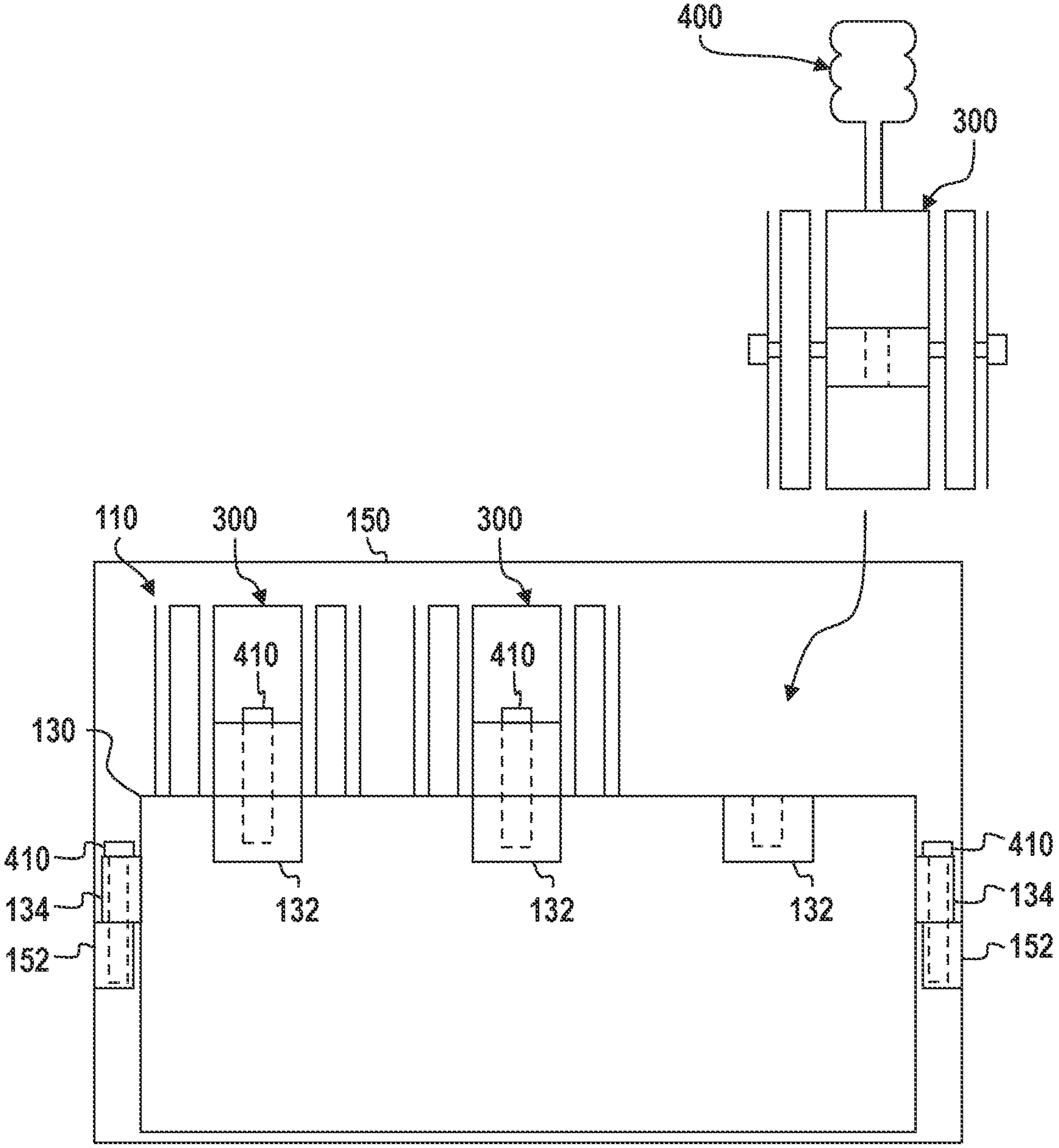
FIG. 6 schematically shows the assembly of a plurality of electronics modules to form an electronics arrangement.

The frame 330 has a holding mechanism 312, which is formed in this example as a drilled hole with a female thread for screwing in a corresponding tool 400 (see FIG. 6). Moreover, the frame 330 has a fastening section 310. In this example, the fastening section 310 is in the form of a protrusion of the frame 330 with a drilled hole. For example, the fastening section 310 is formed in one piece with the frame 330. The drilled hole is designed to pass through a bolt or a screw. Using the fastening section 310 of the frame 330, the electronics module 300 is safely and securely installable in the vacuum-tight housing 150 (see FIG. 2 or 6), with a screwed connection being advantageously able to be released again at all times. The electrical and/or electronic components 201-206 are protected by the protection elements 320 during an installation or removal of the electronics module 300. Further, forces when fastening or releasing the electronics module 300 and/or for holding the electronics module 300 during the installation or removal act only on the frame 330 and not on the printed circuit board PCB.

FIG. 6 schematically shows the assembly of a plurality of electronics modules 130, 300 to form an electronics arrangement 110 in a vacuum-tight housing 150. By way of example, these are three structurally identical electronics modules 300, which correspond to the electronics modules 300 in FIG. 5. For reasons of clarity, the individual elements of the respective electronics module 300 are not individually labelled with a reference sign in FIG. 6. In this example, the electronics modules 300 are installed in the vacuum-tight housing 150 and connected to the electronics module 130 at the same time. By way of example, the electronics module 130 is initially installed in the vacuum-tight housing 150, with fastening sections 134, which are for example arranged in a frame (not depicted here) of the electronics module 130, being brought into contact with corresponding fastening sections 152 of the vacuum-tight housing 150 and being screwed together therewith via a respective screw 410. Subsequently, the three electronics modules 300 are fastened in the electronics module 130 fastened in the vacuum-tight housing 150 in this way. To this end, the electronics module 130 has a respective corresponding fastening section 132 for example, which is brought into contact with the fastening section 310 (see FIG. 5) of the respective electronics module 300 and subsequently screwed via a respective screw 410. The installation of the electronics modules 130, 300 in the vacuum-tight housing 150 is implemented in a cleanroom environment for example (not depicted here).

Two electronics modules 300 have already been installed, with a respective screw 410 being guided through the drilled hole in the fastening section 310 (see FIG. 5) of the frame 330 (see FIG. 5) of the respective electronics module 300 and screwed together with a corresponding fastening section (not depicted here) of the vacuum-tight housing 150 or electronics module 130. The third electronics module 300 is currently being brought into the installation position. To this end, a tool 400 has been fastened to the electronics module, with the tool 400 engaging in the holding mechanism 312 (see FIG. 5) of the electronics module 300. Using the tool 400, the electronics module 300 is able to be brought easily and safely into the installation position by a worker. For example, direct contact with the worker is dispensed with and, moreover, increased force can be applied by way of the holding mechanism 312 without there being the risk of the electronics module 300 being damaged. The electronics arrangement 110 can also be removed from the vacuum-tight housing 150 again in the reverse order, should this be desired for a repair or the like.

Figure 7:
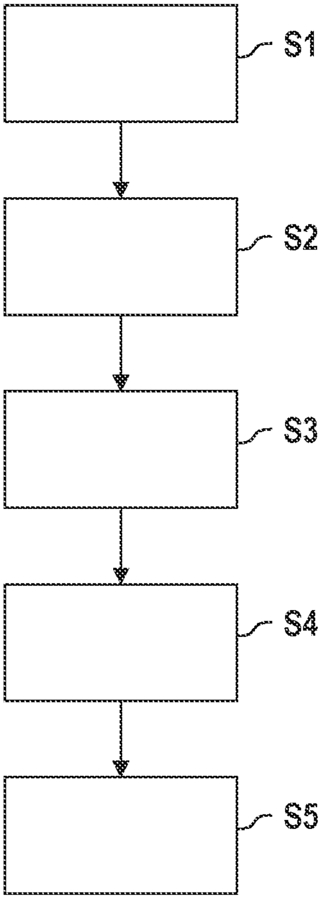
FIG. 7 shows a schematic block diagram of an exemplary method for producing an optical system.

FIG. 7 shows a schematic block diagram for an exemplary method for producing an optical system 100, for example the optical system 100 in FIG. 2. A plurality of individual mirrors 101-106 (see FIG. 2) are provided in a first step S1. A vacuum-tight housing 150 (see FIG. 2 or 6) is provided in a second step. A plurality of electronics modules 120, 130, 200, 300 (see FIGS. 2 and 4-6) are provided in a third step S3. Each electronics module 120, 130, 200, 300 has a plurality of interconnected electronic and/or electrical components 201-206 (see FIG. 4). At least one specific electronics module 120, 130, 200, 300 of the plurality thereof has a printed circuit board PCB (see FIG. 4 or 5), on which the electronic and/or electrical components 201-206 of the specific electronics module 120, 130, 200, 300 are arranged. The printed circuit board PCB is arranged on a frame 230, 330 (see FIG. 4 or 5) of the specific electronics module 120, 130, 200, 300, wherein the frame 230, 330 has at least one fastening section 134, 210, 310 (see FIG. 4, 5 or 6), which is provided to releasably install the specific electronics module 120, 130, 200, 300 in the vacuum-tight housing 150 and/or to connect the specific electronics module to a further electronics module of the electronics arrangement 110, wherein the at least one fastening section 134, 210, 310 of the specific electronics module 120, 130, 200, 300, in the state where it is installed in the vacuum-tight housing 150, is in contact with a corresponding fastening section 132, 152 (see FIG. 6) of the vacuum-tight housing 150 and/or of the further electronics module. The electronics modules 120, 130, 200, 300 are installed in the vacuum-tight housing 150 under cleanroom conditions in a fourth step S4, wherein the respective fastening section 134, 210, 310 is brought into contact with the respective corresponding fastening section 132, 152 such that the electronics modules 120, 130, 200, 300 together form an electronics arrangement 110 (see FIG.

2 or 6) which is configured to individually actuate each individual mirror 101-106. In a fifth step S5, the electronics arrangement 110 is coupled to the individual mirrors 101-106 under cleanroom conditions, whereby the optical system 100 has been provided.

Although the present disclosure has been described with reference to exemplary embodiments, it is modifiable in various ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
100 Optical system
101 Mirror
102 Mirror
103 Mirror
104 Mirror
105 Mirror
106 Mirror
110 Electronics arrangement
111 Actuator/sensor device
112 Actuator/sensor device
113 Actuator/sensor device
114 Actuator/sensor device
115 Actuator/sensor device
116 Actuator/sensor device
120 Electronics module
130 Electronics module
132 Fastening section
134 Fastening section
150 Vacuum-tight housing
152 Fastening section
200 Electronics module
201 Component
202 Component
203 Component
204 Component
205 Component
206 Component
210 Fastening section
212 Holding mechanism
220 Protection element
230 Frame
300 Electronics module
310 Fastening section
312 Holding mechanism
320 Protection element
330 Frame
400 Tool
410 Screw
CONN Plug-in connector
M1 Mirror
M2 Mirror
M3 Mirror
M4 Mirror
M5 Mirror
M6 Mirror
PCB Printed circuit board
S1 Method step
S2 Method step
S3 Method step
S4 Method step
S5 Method step

What is claimed is:

1. An optical system, comprising:
a vacuum-tight housing;
a plurality of actuatable individual mirrors in the vacuum-tight housing; and
an electronics arrangement integrated in the vacuum-tight housing;
wherein:
the electronics arrangement is configured to individually actuate each individual mirror;
the electronics arrangement comprises a plurality of electronics modules;
the electronics modules are releasably installed in the vacuum-tight housing;
each electronics module comprises a plurality of interconnected electronic and/or electrical components;
the electronics modules comprise a first electronics module and a second electronics module;
the first electronics module comprises a printed circuit board;
the electronic and/or electrical components of the first electronics module are arranged on the printed circuit board;
the printed circuit board is supported by a frame of the first electronics module;
the frame of the first electronics module comprises a fastening section configured to releasably connect the first electronics module to: i) the vacuum-tight housing; and/or ii) second electronics module of the electronics arrangement; and
when installed in the vacuum-tight housing, the fastening section of the first electronics module contacts: i) a fastening section of the vacuum-tight housing; and/or ii) a fastening section of the second electronics module.

2. The optical system of claim 1, wherein:
the first electronics module comprises a holding mechanism and/or a protection element;
when the first electronics module comprises the holding mechanism, the holding mechanism is configured to securely hold the first electronics module while the first electronics module is being installed in the vacuum-tight housing; and
when the first electronics module comprises the protection element, the protection element is configured to protect at least a subset of the electronic and/or electrical components of the first electronics module from mechanical damage and/or from an electrostatic discharge.

3. The optical system of claim 1, wherein:
the first electronics module comprises a protection element configured to securely hold the first electronics module while the first electronics module is being installed in the vacuum-tight housing; and
the protection element comprises a planar, rigid element that partly covers a side of the printed circuit board.

4. The optical system of claim 3, wherein the planar, rigid element completely covers the side of the printed circuit board.

5. The optical system of claim 1, wherein:
the first electronics module comprises a protection element configured to securely hold the first electronics module while the first electronics module is being installed in the vacuum-tight housing; and
the protection element comprises at least one member selected from the group consisting of a plastic, a metal and a composite.

6. The optical system of claim 1, wherein:
the first electronics module comprises a protection element configured to securely hold the first electronics module while the first electronics module is being installed in the vacuum-tight housing; and
the protection element comprises an electrically insulating layer.

7. The optical system of claim 1, wherein:
the first electronics module comprises a holding mechanism configured to securely hold the first electronics module while the first electronics module is being installed in the vacuum-tight housing; and
the holding mechanism is integrated into the frame.

8. The optical system of claim 1, wherein:
the first electronics module comprises a protection element configured to securely hold the first electronics module while the first electronics module is being installed in the vacuum-tight housing; and
the protection element is fastened to the frame.

9. The optical system of claim 1, wherein:
the first electronics module comprises a holding mechanism integrated in a protection element;
the holding mechanism is configured to securely hold the first electronics module while the first electronics module is being installed in the vacuum-tight housing; and
the protection element is configured to protect at least a subset of the electronic and/or electrical components of the first electronics module from mechanical damage and/or from an electrostatic discharge.

10. The optical system of claim 1, wherein:
the first electronics module comprises a holding mechanism configured to securely hold the first electronics module while the first electronics module is being installed in the vacuum-tight housing; and
the holding mechanism comprises a receptacle for a tool so that the first electronics module is held by the tool when the tool is connected to the receptacle.

11. The optical system of claim 1, wherein:
the frame is configured to dissipate thermal energy produced by the electronic and/or electrical component during the operation of the optical system; and
the frame is configured to transfer the thermal energy to a heatsink of the electronics module and/or of the vacuum-tight housing.

12. The optical system of claim 11, wherein the frame comprises a metal.

13. The optical system of claim 1, wherein the frame comprises a metal.

14. The optical system of claim 1, wherein the frame consists of a metal.

15. The optical system of claim 1, wherein the optical system is usable in a vacuum housing of an EUV lithography apparatus.

16. An apparatus, comprising:
an optical system according to claim 1,
wherein the apparatus is a lithography apparatus.

17. The apparatus of claim 16, wherein the apparatus is an EUV lithography apparatus.

18. The apparatus of claim 16, wherein the optical system is a projection optical unit of the apparatus.

19. A method, comprising:
providing a plurality of individual mirrors;
providing a vacuum-tight housing;
providing a plurality of electronics modules, each electronics module comprising a plurality of interconnected electronic and/or electrical components, a first electronics module of the plurality thereof comprising a printed circuit board on which the electronic and/or electrical components of the first electronics module are arranged, the printed circuit board being arranged on a frame of the first electronics module, the frame comprising a fastening section to releasably connect the first electronics module to: i) the vacuum-tight housing and/or ii) a further electronics module of the electronics arrangement, the fastening section of the first electronics module, when installed in the vacuum-tight housing, contacting a corresponding fastening section of the vacuum-tight housing and/or of the further electronics module;
installing the plurality of electronics modules in the vacuum-tight housing under cleanroom conditions, the fastening section contacting the respective corresponding fastening section so that the electronics modules together form an electronics arrangement configured to individually actuate each individual mirror; and
coupling the electronics arrangement to the individual mirrors to provide the optical system under cleanroom conditions.

20. The method of claim 19, wherein coupling the electronics arrangement to the individual mirrors to provide the optical system under cleanroom conditions is performed in a cleanroom of class 6 or higher pursuant to ISO 14644-1.

* * * * *